(12) United States Patent
Hu et al.

(10) Patent No.: US 9,941,639 B2
(45) Date of Patent: Apr. 10, 2018

(54) SHIELDING ARRANGEMENT FOR HIGH-CURRENT APPLICATIONS

(71) Applicant: Robert Bosch GmbH, Stuttgart (DE)

(72) Inventors: Zhenyu Hu, Leonberg (DE); Martin Saur, Salach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 24 days.

(21) Appl. No.: 14/917,514

(22) PCT Filed: Jul. 24, 2014

(86) PCT No.: PCT/EP2014/065969
§ 371 (c)(1),
(2) Date: Mar. 8, 2016

(87) PCT Pub. No.: WO2015/039791
PCT Pub. Date: Mar. 26, 2015

(65) Prior Publication Data
US 2016/0218465 A1 Jul. 28, 2016

(30) Foreign Application Priority Data

Sep. 18, 2013 (DE) .......................... 10 2013 218 726

(51) Int. Cl.
*H01R 13/648* (2006.01)
*H02G 15/068* (2006.01)
(Continued)

(52) U.S. Cl.
CPC ......... *H01R 13/648* (2013.01); *H01R 9/0524* (2013.01); *H01R 13/53* (2013.01);
(Continued)

(58) Field of Classification Search
CPC .......................... H05K 9/0018; H05K 9/0098
(Continued)

(56) References Cited

U.S. PATENT DOCUMENTS 4,921,449 A * 5/1990 Fish ........................ H01R 9/032
439/585
6,007,383 A 12/1999 Cabes
(Continued)

FOREIGN PATENT DOCUMENTS

DE 3822573 1/1990
DE 69805088 10/2002
(Continued)

OTHER PUBLICATIONS

International Search Report for PCT/EP2014/065969, dated Mar. 11, 2015.

*Primary Examiner* — Tho D Ta
*Assistant Examiner* — Marcus Harcum
(74) *Attorney, Agent, or Firm* — Norton Rose Fulbright US LLP; Gerard Messina

(57) ABSTRACT

A shielding system for high-current applications, having a connecting cable that has an insulated conductor (22) and a cable shielding surrounding the insulated conductor, as well as a shielding housing having a feed-through. In addition, the shielding system has a hollow cylindrical and electrically conductive shielding sleeve. The insulated conductor is fed through the shielding sleeve. The shielding sleeve is situated in the area of the feed-through of the shielding housing, so that the shielding housing abuts a jacket surface of the shielding sleeve. The cable shielding lies against a jacket surface of the shielding sleeve. The cable shielding is electrically connected to the shielding housing via the shielding sleeve.

15 Claims, 4 Drawing Sheets

(51) Int. Cl.

| | |
|---|---|
| *H01R 9/05* | (2006.01) |
| *H01R 13/53* | (2006.01) |
| *H02G 3/06* | (2006.01) |
| *H01R 24/38* | (2011.01) |
| *H05K 9/00* | (2006.01) |
| *H01R 103/00* | (2006.01) |
| *H01R 13/6596* | (2011.01) |
| *H02G 3/08* | (2006.01) |

(52) U.S. Cl.
CPC ........... *H01R 24/38* (2013.01); *H02G 3/0616* (2013.01); *H02G 15/068* (2013.01); *H05K 9/0018* (2013.01); *H01R 13/6596* (2013.01); *H01R 2103/00* (2013.01); *H02G 3/083* (2013.01); *H05K 9/0098* (2013.01)

(58) Field of Classification Search
USPC .................. 174/377, 360, 385, 362, 18, 384
See application file for complete search history.

(56) References Cited

U.S. PATENT DOCUMENTS 6,583,357 B2 * 6/2003 Rubenstein .......... H02G 3/0666
  16/2.1
7,679,935 B2 * 3/2010 Horng .................. H05K 9/0037
  174/350

FOREIGN PATENT DOCUMENTS

| | | |
|---|---|---|
| DE | 10354286 | 7/2004 |
| DE | 202005014601 | 11/2005 |
| EP | 1313171 | 5/2003 |

* cited by examiner

SHIELDING ARRANGEMENT FOR HIGH-CURRENT APPLICATIONS

FIELD

The present invention relates to electrical connection systems. In particular, the present invention relates to a shielding system for connection systems in high-current applications.

BACKGROUND INFORMATION

Electrical connection systems can be used to produce an electrical connection between two or more components. This can be done by plug connections or lines.

In particular, in the case of high-current applications, electromagnetic fields can arise around an electrical conductor. In order to avoid impairment of the environment around the conductor due to these electromagnetic fields, for example a surrounding shielding may be required. In the case of high-current lines, for example a shielding braid can be integrated in the line insulation for this purpose.

Electromagnetic shieldings can also be required for connection systems. Due to the mechanical and electrical demands on these connection systems, and the occurrence of, in part, very high currents in the range of for example 50 to 300 A, high demands are also placed on the quality of the electrical contacting and on the robustness of the mechanical construction. At the same time, an electromagnetic shielding can be required that is as good as possible. In many cases, taking all these demands into account can require compromises with regard to particular features.

SUMMARY

Specific example embodiments of the present invention are based on, inter alia, the following considerations: components of high-current connection systems, for example plug connections, can for example be surrounded by a shielding plate for the electromagnetic shielding. The shielding plate can surround a connection system either completely or partially, thus achieving an effective shielding of electromagnetic fields. This shielding plate can be made of a metallic material and can be electrically conductive. In order to connect the shielding plate to a cable shielding of a connecting cable, an outer insulation that may be present of the connecting cable can be partially removed, and the exposed cable shielding can be electrically and mechanically connected to the shielding plate. This can take place for example through crimping or clamping. Because in some cases high currents can also occur in the cable shielding and in the shielding plate, a reliable contacting between these components with a low electrical resistance is desirable. Due to movements of the connecting cable relative to the shielding housing, for example due to vibrations or during assembly, in addition a mechanical decoupling of the connecting cable and the shielding housing can be necessary.

Thus, the present invention can, inter alia, improve a mechanical stability, an electrical contacting, and/or an electromagnetic shielding of a connection system for high-current applications.

Therefore, a shielding system is provided for high-current applications that has a connecting cable having an insulated conductor and a cable shielding surrounding the insulated conductor, as well as a shielding housing having a feed-through. The shielding system also has a hollow cylindrical electrically conductive shielding sleeve. The insulated conductor is fed through the shielding sleeve, which has at one longitudinal end a sleeve area at the housing side, and at another longitudinal end has a sleeve area at the cable side. The housing-side sleeve area of the shielding sleeve is situated in the region of the feed-through of the shielding housing, and the shielding housing abuts a jacket surface of the housing-side sleeve area. The cable shielding is adjacent to a jacket surface of the cable-side sleeve area, and the cable shielding is electrically connected to the shielding housing via the shielding sleeve.

One advantage can be regarded as a better electrical contacting with improved mechanical decoupling of the shielding housing and connecting cable. In addition, a lower degree of wear of the contact point over the lifespan can be enabled.

A shielding system can be used to reduce the electromagnetic fields caused by the electrical current in a region outside the shielding system. Here, the cable shielding of the connecting cable acts to reduce the electromagnetic fields occurring in the environment of the connecting cable, which can be caused by the electrical current transported in the insulated conductor. The feed-through of the shielding housing can be used to make it possible to route the connecting cable, with the current-carrying electrical conductor, into an internal region of the shielding housing.

A shielding sleeve can be understood for example as a tube-shaped metallic component whose inner diameter can permit feeding of the insulated conductor through the shielding sleeve, and whose outer diameter is preferably selected such that the shielding sleeve can be introduced into the feed-through at least in the sleeve region at the housing side. At the same time, the outer diameter of the shielding sleeve is selected such that an electrical and mechanical contacting of the shielding sleeve with the shielding housing is possible. The housing-side sleeve area can have an outer diameter that is the same as or different from that of the sleeve area at the cable side, and/or can have an inner diameter that is the same as or different from that of the sleeve area at the cable side. The cable-side sleeve area stands in mechanical and electrical contact with the cable shielding with its jacket surface. This can be achieved for example through clamping, soldering, or crimping.

In other words, the shielding sleeve can be understood as a mechanical and electrical bonding element between the connecting cable and the shielding housing.

According to an example, the shielding system provides the electromagnetic shielding of an individual insulated conductor. In another example, the shielding system provides the electromagnetic shielding of a multiplicity of insulated lines, for example as a collective shielding or summed shielding of a plurality of lines.

In an example, the housing-side sleeve area and the cable-side sleeve area can be situated at a distance from one another on the shielding sleeve. In other words, an intermediate area can be situated between the two sleeve areas, so that the two sleeve areas do not pass directly into one another. In a further example, the housing-side sleeve area is connected directly to the cable-side sleeve area.

In a specific embodiment of the present invention, a diameter of the insulated conductor is smaller, for example by more than 10%, preferably more than 20%, than an inner diameter of the shielding sleeve, so that the insulated conductor is capable of movement in the radial direction in an internal region of the shielding sleeve. Due to the smaller diameter of the insulated conductor, there advantageously results room for movement of the insulated conductor inside the shielding sleeve. In this way, a radial movement of the insulated conductor is possible within a limited range. This can have the advantage that a radial movement or displacement of the insulated conductor cannot cause, or can cause only to a limited extent, a force acting radially on the shielding sleeve. In other words, in this way a mechanical decoupling or movement decoupling can be achieved. In this way, for example given the use of the connection system in the environment of internal combustion engines, a transmission of vibrations between the connecting cable and the shielding housing can be reduced or eliminated. This also advantageously reduces the risk that material fatigue and resulting breakage of the connection point will occur, for example due to vibrations or temperature changes at the transition point. Also, in this way the risk of the formation of leaks of electromagnetic radiation at the transition point is advantageously reduced, which could occur for example due to material fatigue or shearing.

An insulated conductor can, for example, have a massive wire or strands, each made for example of copper or a copper alloy, and for example having a conductor cross-section of up to 75 mm$^2$. The conductor can be surrounded at its circumference by an insulating layer that encloses the conductor, which can be made for example of plastic or other suitable materials.

In a specific embodiment of the present invention, the cable shielding is capable of radial movement relative to the insulated conductor, outside the shielding housing and outside the shielding sleeve, in a region adjacent to the shielding sleeve, so that the cable shielding in this region and the shielding sleeve are mechanically decoupled relative to one another. The radial movability of the cable shielding relative to the shielding sleeve permits, within certain limits, a radial movement of the shielding sleeve or of the connecting cable relative to one another in mechanically decoupled fashion. In this way, advantageously the transmission of movements or displacements, such as vibrations, between the connecting cable and the shielding sleeve can be reduced or eliminated. In an example, in addition to the radial movability of the cable shielding, the insulated conductor is also capable of radial movement inside the shielding sleeve. In a further example, the cable shielding of the connecting cable is surrounded at its outer side by an external insulating layer that can be made for example of plastic.

In a specific embodiment of the present invention, the radial movability is achieved in that in this region, i.e., outside the shielding housing and outside the shielding sleeve, in a region adjacent to the shielding sleeve, the cable shielding can be changed in its shape, and is widened in the radial direction in this region. An advantage of the widening can be that in this way the necessary space for movement is created that enables the radial movement. The widening can be seen as a simple possibility for increasing a circumference of the cable shielding that can be achieved using comparatively simple measures. For example, an additional movability of the cable shielding in the form of a wire strand can result due to the widening, because here the respective distances between the individual strands are made larger. Such a cable shielding, for example realized as a shielding braid, advantageously improves the shielding and also improves a mechanical decoupling between the connecting line and the shielding sleeve or shielding housing.

In a specific embodiment of the present invention, in the region of the feed-through the shielding housing forms outward contact clips that extend generally parallel to the jacket surface of the housing-side sleeve area and are realized so as to abut the jacket surface of the housing-side sleeve area. An advantage of such contact clips can be a larger contact surface between the shielding housing and the jacket surface of the housing-side sleeve area, which can enable higher frictional forces and/or contact forces and thus a better mechanical hold. Moreover, in this way it is prevented that a gap occurs between the contact clips and the sleeve area, or between the feed-through and the sleeve area, which could act as a kind of leak for electromagnetic radiation. In this way, a particularly effective shielding is brought about.

Contact clips can, for example, be understood as collars or projections that run transverse to a side surface of the shielding housing. For example, in the area of the feed-through plate segments at the edge of the feed-through are bent outward and thus act as contact clips.

According to a specific embodiment of the present invention, the shielding system has, in the housing-side sleeve area and/or in the cable-side sleeve area, a fastening strip that runs externally around the shielding sleeve circumferentially. The fastening strip is fashioned to produce a press-on pressure on the respective external surfaces of the contact clips, or a press-on pressure on the cable shielding in the direction of the jacket surfaces of the shielding sleeve, so that the contact clips and/or the cable shielding are fastened to the respective jacket surfaces of the shielding sleeve.

An advantage of the fastening strip can be a press-on pressure that is distributed uniformly over the circumference of the shielding sleeve. In addition, the fastening strip can advantageously increase a press-on pressure of the contact clips or of the cable shielding at the respective jacket surfaces, so that a secure mechanical and/or electrical contacting can be achieved. In addition, an advantageous ability to withstand vibration and temperature change can be achieved, as well as reduced wear of the contact point and of the connection system. Through the use of a fastening strip, a reduced setting behavior due to temperature, i.e. temperature-caused displacements, can also be achieved. A further advantage can be that the fastening strip can be produced at low cost and is comparatively simple to install. Moreover, the fastening strip advantageously brings about a leak-free shielding, in that an electrically conductive connection that runs circumferentially is produced at all transition points between housing/contact clips and shielding sleeve, or between the cable shielding and the shielding sleeve.

In a specific embodiment of the present invention, a circumference of the fastening strip can be adjusted in order to enable modification of a press-on pressure of the contact clips and/or of the cable shielding on the jacket surfaces of the shielding sleeve. For example, through the adjustable circumference a limited elasticity of the fastening strip can be exploited in order to modify the resulting radial press-on force. In an example, a press-on pressure can be increased by reducing the circumference of the fastening strip.

A circumference of the fastening strip can for example be achieved by feeding the fastening strip through a clip situated at one end of the fastening strip, and suitable fixing of the fastening strip in the clip. The fastening strip can in particular be realized in a manner similar to a cable binder.

The fastening strip advantageously enables a modular production of the individual components, and also brings about a particularly simple, fast, and low-cost assembly of the individual components to form a shielding system that brings about an effective shielding. In addition, the use of a fastening strip also permits a rapid disassembly of the shielding system, e.g., if the connecting cable has to be changed. Such disassembly can be carried out without damage to the individual components of the shielding system.

In a specific embodiment of the present invention, the fastening strip includes a metal. An advantage is that a fastening strip made, for example, of spring steel can produce a comparatively high press-on pressure with low inherent weight. In addition, a metallic fastening strip can have increased mechanical stability. Particularly advantageously, a metallic fastening strip produces, in a simple manner, a leak-free and effective shielding of the electromagnetic field present inside the shielding system due to the current-conducting connecting cable.

In a specific embodiment of the present invention, the fastening strip includes a plastic, and is fashioned to enclose the cable shielding with the jacket surface of the cable-side sleeve area in contour-fitting fashion. An advantage of plastic is that, for example through heating, an adaptation to the respective individual shape of the respective jacket surfaces together with the contact clips, or together with the cable shielding, can be enabled. In other words, a surface of the shielding sleeve can be tightly enclosed together with the respectively abutting contact clips or cable shielding, so that if warranted the plastic fastening strip can also be adapted to radial fluctuations in the circumference of the jacket surface. A further exemplary realization provides a metal-plastic compound as material for the fastening strip, e.g., plastic with a metallic coating. This combines the mechanical advantages of the plastic with the advantage of a leak-free shielding of electromagnetic radiation due to the metal coating.

In a specific embodiment of the present invention, the fastening strip is a shrink sleeve. An advantage of shrink sleeves can be that through simple heating, for example using hot air, a contour-fitting and closing of the shielding sleeve and of the contact clips, or cable shielding, by the plastic can be possible. Shrink sleeves can be characterized in that they can easily be guided over the shielding sleeve, or the cable shielding or the contact clips, for example through previous widening and cooling, and in a following step can be drawn together by heating. Shrink sleeves are available in many different variants at comparatively low cost. In addition, they bring about a good setting behavior in response to temperature fluctuations during operation. This is because a thermally shrunk shrink sleeve is for example not susceptible to the temperature fluctuations that occur under normal operating conditions, and fastens the cable shielding on the shielding sleeve without play. At the same time, a shrink sleeve can also be easily removed without damaging the cable shielding and the shielding sleeve, for example through the use of thermal methods or through mechanical removal.

In a specific embodiment of the present invention, the shielding sleeve has, at the respective longitudinal ends of the sleeve areas, bulges that run around in the circumferential direction and are directed radially outward. An advantage of the bulges can be that a moving away in the longitudinal direction of the contact clips adjacent to the respective jacket surfaces, or of the cable shielding in the regions of the shielding sleeve outside the housing-side sleeve area or the cable-side sleeve area, can be prevented or made more difficult. In this way, an overall better mechanical stability can result, in particular with regard to tensile forces acting in the axial direction of the shielding sleeve.

In an example, the shielding sleeve has three bulges, two of the bulges being situated at the respective end faces of the shielding sleeve, and the third bulge being situated as a common bulge of the housing-side sleeve area and of the cable-side sleeve area on a length of the shielding sleeve.

According to a specific embodiment of the present invention, in their extension from the shielding housing toward the jacket surface, the contact clips run in stepped fashion, so that a partial region of the contact clips in the area of the bulges is further away from a central axis of the shielding sleeve than is a partial area of the contact clips between the bulges of the housing-side shielding sleeve. An advantage of the stepped construction can be that the region contacting the jacket surface of the contact clip or the cable shielding can be situated in a radially lower-lying area of the shielding sleeve. The bulges can be understood as mechanical barriers that can prevent or make more difficult an axial movement of the contact clips or the cable shielding away from the jacket surface of the shielding sleeve.

According to a specific embodiment of the present invention, a width of the strip in the longitudinal direction of the shielding sleeve is smaller than a distance between the two bulges of the respective sleeve areas. An advantage here can be that in this way, the strip can be situated completely in the region between the bulges, thus enabling an effective fastening and contacting in the area of the jacket surfaces between the bulges. At the same time, through a suitable of the fastening strip a common contact surface that is as large as possible, and thus an advantageous distribution of the press-on forces over the jacket surfaces, can be achieved.

According to a specific embodiment of the present invention, the housing-side sleeve area and/or the cable-side sleeve area has recesses and/or bulges on the jacket surfaces. An advantage can be an enlargement of the effective contact surface and/or a better mechanical connection between the cable shielding and the shielding sleeve, or between the contact clips and the shielding sleeve.

The enlargement of the contact surface advantageously brings it about that the electrical transition resistance from the cable-side sleeve area to the cable shielding is reduced. Together with the better mechanical bonding, in this way a reliable shielding of the electromagnetic fields, lasting over the lifespan, of the current-conducting connecting cable is brought about. In addition, the larger contact surface advantageously reduces the risk that leaks of electromagnetic radiation between the shielding sleeve and the cable shielding can occur. Particularly advantageously, the cable-side shielding is in this way also permanently insensitive to mechanical changes of load, due for example to vibrations or temperature-caused changes in dimension.

According to a specific embodiment of the present invention, a profile of the jacket surfaces is made with a wavy shape. In other words, circumferential grooves or recesses can be provided for example in the circumferential direction.

Such a wave-shaped realization is particularly advantageous, for example a wave shape not having sharp edges, because in this way the fastening of the cable shielding for example to a shrink sleeve can take place in particularly reliable and damage-free fashion, and in this way a pull-off force in the axial direction required to destroy the shielding can be advantageously greatly increased.

In an aspect of the present invention, a plug connector for a motor vehicle is proposed having a shielding system as described above.

It is to be noted that possible features and advantages of a shielding system according to the present invention are described herein with reference to various specific embodiments. A person of ordinary skill in the art will understand that the individual features can be suitably combined with one another or exchanged in order in this way to arrive at further specific embodiments and possible synergistic effects.

BRIEF DESCRIPTION OF THE DRAWINGS

In the following, exemplary embodiments of the present invention are described with reference to the figures; neither the description or the figures are to be interpreted as limiting the present invention.

Figure 1:
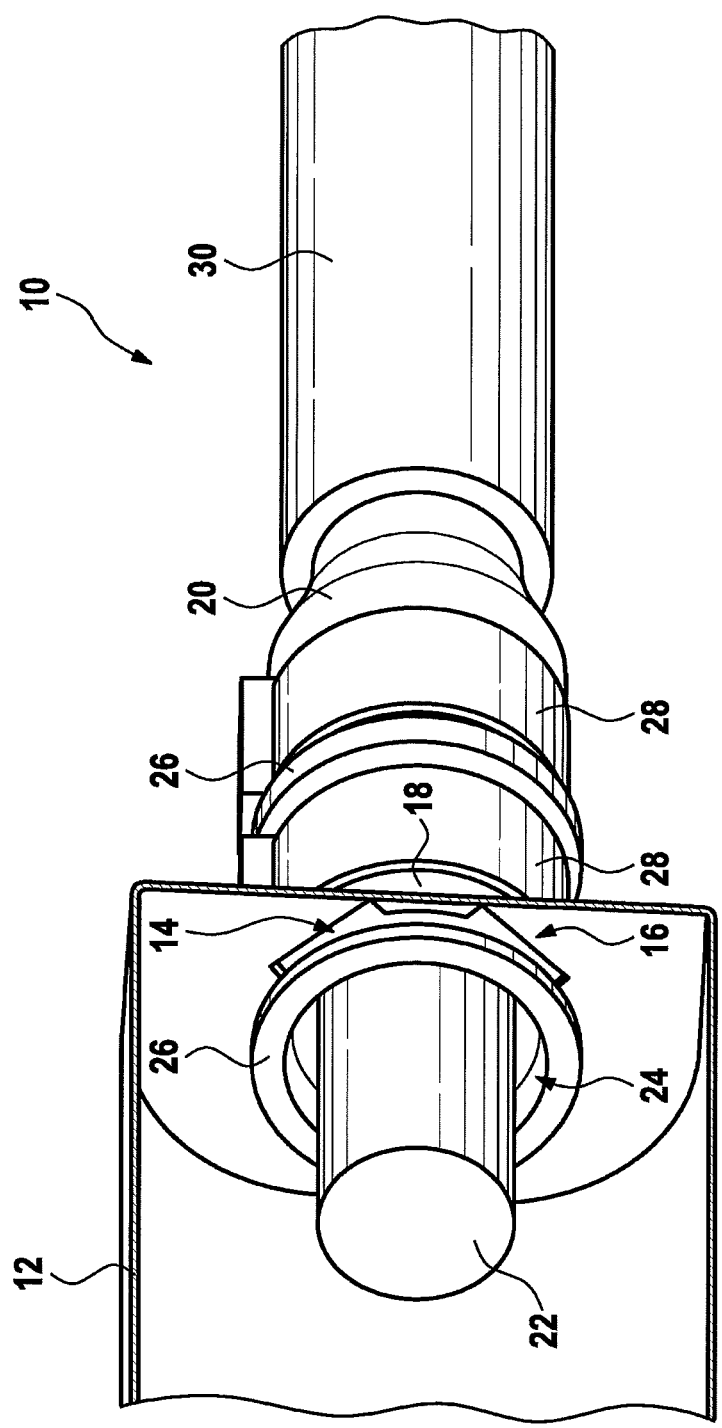
FIG. 1 shows an example of a shielding system according to the present invention in a spatial representation.

The Figures are merely schematic and are not to scale. Identical reference characters in the Figures designate features that are identical or that have identical function. If a plurality of features are shown in a drawing, each of these features can be regarded as independent from one another, and are not necessarily to be understood in combination with other depicted features.

DETAILED DESCRIPTION OF EXAMPLE EMBODIMENTS

In FIG. 1, a shielding system 10 is shown for high-current applications, schematically and in a spatial representation. Shielding system 10 has a shielding housing 12 on whose side surface there is situated a feed-through 14. Extending out from feed-through 14, shielding housing 12 has a plurality of contact clips 16 that protrude orthogonally from the side surface of shielding housing 12. In feed-through 14 there is situated a shielding sleeve 18 that, in the example shown here, extends from shielding housing 12 up to a cable shielding 20. Cable shielding 20 is additionally surrounded externally at its circumference by an external insulating layer 30. Cable shielding 20 surrounds an insulated conductor 22 that is guided via a length of shielding sleeve 18 through shielding sleeve 18 at least into an internal region of shielding housing 12. In its internal region, insulated conductor 22 has an electrical conductor (not shown) that is surrounded by an insulation. For example, this electrical conductor (not shown) of insulated conductor 22 can be a massive copper wire or copper strands. Cable shielding 20 can for example be fashioned as a shielding braid made of copper or some other highly conductive material. For example, such a shielding braid is made up of a plurality of layers and has braided meshes that enable an effective shielding of the electromagnetic fields of current-conducting insulated conductor 22 running in its interior. The shielding braid can for example have a certain degree of flexibility along its axial direction of extension, and can be stretchable without impairment of the shielding effect through leaks of electromagnetic radiation.

In the example shown here, a diameter of insulated conductor 22 is smaller than an inner diameter of shielding sleeve 18. This results in an intermediate space 24 between the insulated conductor and an inner wall of shielding sleeve 18. This can advantageously enable a limited radial movability of insulated conductor 22 inside shielding sleeve 18. Shielding sleeve 18 has radially outward-directed bulges 26 at each of its longitudinal ends, as well as on a length of shielding sleeve 18.

Contact clips 16 are adjacent to a jacket surface of shielding sleeve 18, and are fastened on the jacket surface of shielding sleeve 18 with the aid of a fastening strip 28 that runs externally around the circumference of the shielding sleeve, via a press-on pressure on the respective external surfaces of contact clips 16. In the example shown here, the circumferential fastening strip 28 is a cable binder made of plastic.

Figure 2:
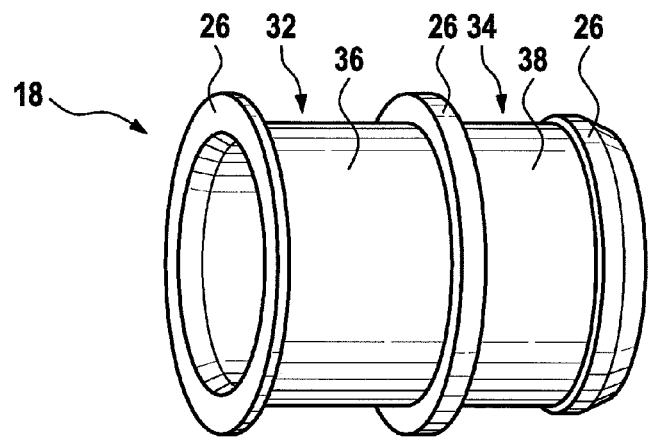
FIG. 2 shows an example of a shielding sleeve of a shielding system according to the present invention.

FIG. 2 shows a shielding sleeve 18 of a shielding system 10 (see FIG. 1) according to the present invention, in a spatial representation. Shielding sleeve 18 has a housing-side sleeve area 32 and a cable-side sleeve area 34. Housing-side sleeve area 32 has on its external surface a jacket surface 36, running around in the circumferential direction, of housing-side sleeve area 32, as well as a jacket surface 38 of cable-side sleeve area 34. In addition, each of sleeve areas 32, 34 has bulges 26 at each end face, inner third bulge 26 forming a common bulge 26 both of housing-side sleeve area 32 and of cable-side sleeve area 34. In order to feed through insulated conductor 22 (see FIG. 1), shielding sleeve 18 has a hollow cylindrical construction.

Figure 3:
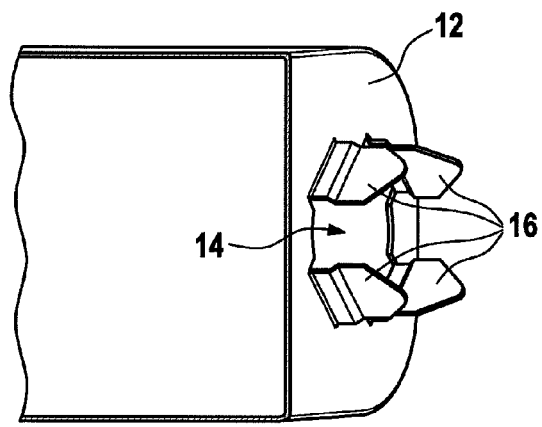
FIG. 3 shows an example of a shielding housing having contact clips as a part of a shielding system according to the present invention.

FIG. 3 shows a spatial representation of a shielding housing 12 as part of a shielding system 10 according to the present invention. Shielding housing 12 has a feed-through 14 on a side surface. At the edge of feed-through 14, contact clips 16 extend in the orthogonal direction, or in a direction going out transversely from the side surface, each connected with one side to the edge of feed-through 14. Contact clips 16 run in stepped fashion in their extension from shielding housing 12 up to jacket surface 36 of housing-side sleeve area 32 (see FIG. 2).

Figure 4:
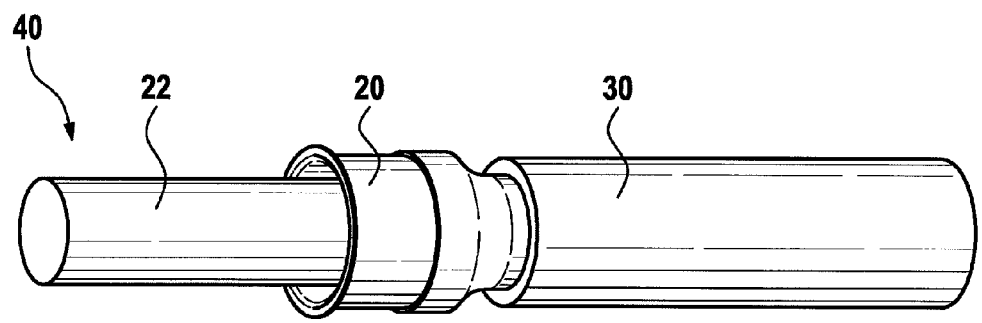
FIG. 4 shows an example of a connecting cable of a shielding system according to the present invention.

FIG. 4 shows an example of a connecting cable 40 of a shielding system 10 according to the present invention, having an insulated conductor 22, a cable shielding 20, and an outer insulation 30. In the interior of the insulation, insulated conductor 22 has an electrical conductor (not shown). Cable shielding 20 is, as shown here, for example widened in its circumference for the purpose of later being pushed onto cable-side sleeve area 34 of shielding sleeve 18 (see FIG. 2). Here, the shape of the widening can for example also take into account bulges 26 of shielding sleeve 18.

Figure 5:
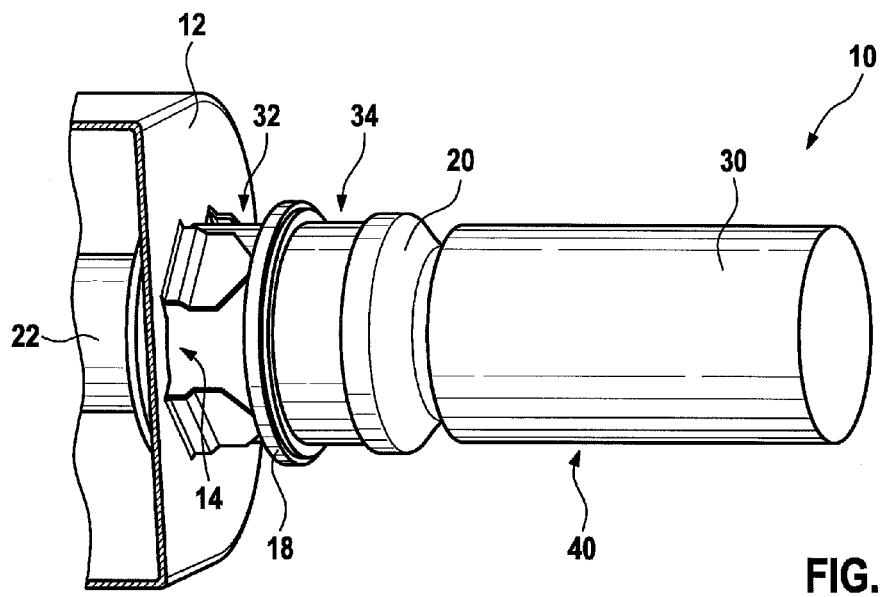
FIG. 5 shows an example of a shielding system according to the present invention in a preassembled state.
Figure 6:
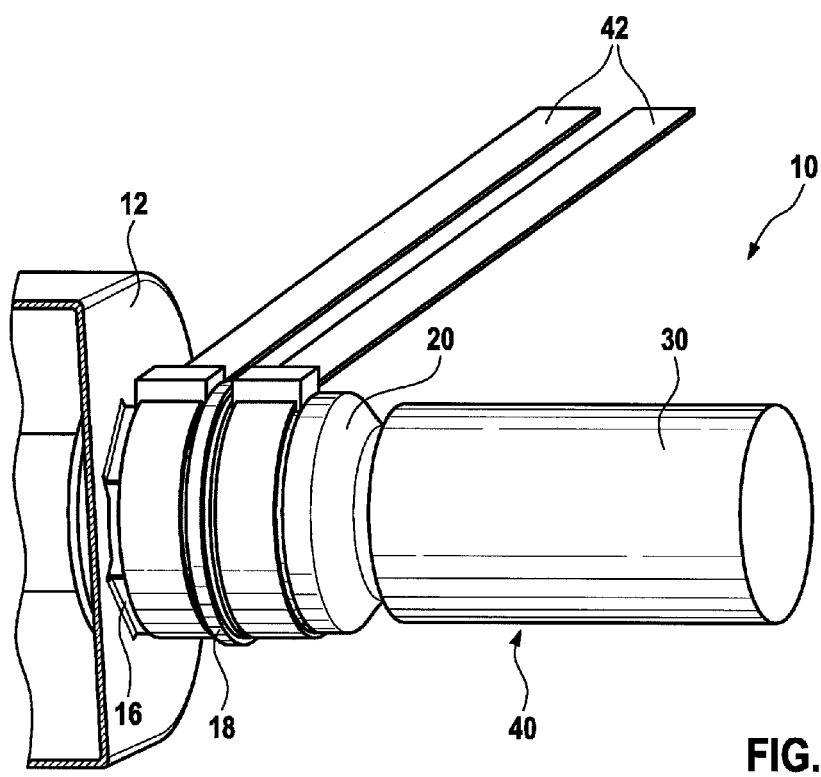
FIG. 6 shows an example of a shielding system according to the present invention in a completed state.

FIG. 5 and FIG. 6 show, in simplified exemplary fashion, a preassembled and a completed shielding system 10. As shown in FIG. 5, in an example first housing-side sleeve area 32 of shielding sleeve 18 is brought into feed-through 14 of shielding housing 12. In a further step, insulated conductor 22 is fed through shielding sleeve 18. For this purpose, ahead of time a partial piece of an external insulation 30 that may be present of connecting cable 40 is de-insulated, thus exposing insulated conductor 22. Cable shielding 20, also exposed ahead of time, is pushed on over cable-side sleeve area 34 after the widening.

Corresponding to the representation in FIG. 6, in a following step a mechanical fastening of contact clips 16 of shielding housing 12 to shielding sleeve 18, as well as a mechanical fastening of cable shielding 20 to shielding sleeve 18, is carried out. This takes place in that a cable binder 42 is in each case attached circumferentially around an external surface of contact clips 16, and a further cable binder 42 is circumferentially attached around cable shielding 20 of connecting cable 40. Here, a circumference of cable binder 42 can be made smaller for example by pulling on a protruding end of cable binder 42, thus increasing a press-on pressure of contact clips 16, or of cable shielding 20, on shielding sleeve 18. In the example shown here, cable shielding 20 is movable in a region between outer insulation 30 and shielding sleeve 18, so that connecting cable 40 is mechanically decoupled from shielding sleeve 18 and from shielding housing 12.

Figure 7:
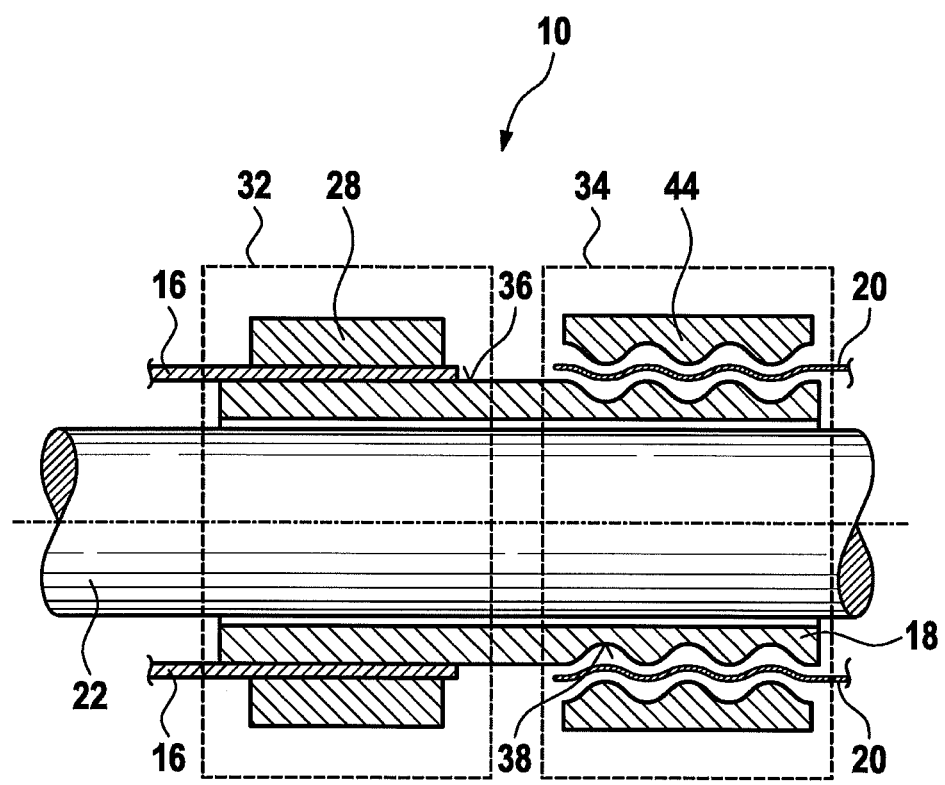
FIG. 7 shows a sectional representation of a detail of an example of a shielding system according to the present invention having a wave-shaped jacket surface and a shrink tube as fastening strip.

FIG. 7 shows a detail of an example of a shielding system 10 according to the present invention in a simplified sectional representation. A shielding sleeve 18 is shown through which an insulated conductor 22 is fed. Shielding sleeve 18 has a housing-side sleeve area 32 and a cable-side sleeve area 34. In housing-side sleeve area 32, contact clips 16 extend from a shielding housing 12 (see FIG. 1), and are pressed by a fastening strip 28 onto a jacket surface 36 of housing-side sleeve area 32, and fastened in this way. Fastening strip 28 can for example be a cable binder 42 (see FIG. 6) made of plastic or metal plate. In cable-side sleeve area 34, jacket surface 38 of shielding sleeve 18 has a wavy shape in profile. The wave shape can for example be realized in the radial direction, the axial direction, or also obliquely, and can bring about an advantageous mechanical coupling with regard to the contact forces and/or tensile forces present on shielding sleeve 18.

Along a jacket surface 38 of cable-side sleeve area 34, a cable shielding 20 is attached. For the mechanical fixing or fastening of cable shielding 20 on jacket surface 38 of cable-side sleeve area 34, as a fastening strip a shrink sleeve 44 is pushed circumferentially over cable shielding 20 and the jacket surface. In FIG. 7, shrink sleeve 44 is shown in the widened state. In a following step, shrink sleeve 44 can for example be heated by hot air, causing shrink sleeve 44 to become smaller in its circumference, or to draw together in the radial direction. As a result, cable shielding 20 is pressed into the wave-shaped jacket surface 38 of cable-side sleeve area 34, and is thereby fastened. In an example, the shrink sleeve is made of a plastic, which can have the advantage that a radially inward-directed surface structure or contour of shrink sleeve 44 can be well-fitted to a profile of jacket surface 38 and of cable shielding 20. Through the drawing together, a press-on pressure, inward in the radial direction, is produced on shielding sleeve 18, which can enable an advantageous fixing and electrical connection, as well as a mechanical fastening, of cable shielding 20 on shielding sleeve 18. Here, cable shielding 20 can be for example a foil, wire strands, or electrically conductive mesh.

It is to be noted that "including" does not exclude any other elements or steps, and "a" does not exclude a plurality. In addition, it is to be noted that features or steps that have been described with reference to one of the above exemplary embodiments can also be used in combination with other features or steps of other above-described exemplary embodiments.

What is claimed is:

1. A shielding system for a high-current application, comprising:
    a connecting cable having an insulated conductor and a cable shielding surrounding the insulated conductor;
    a shielding housing having a feed-through; and
    a hollow cylindrical electrically conductive shielding sleeve, the insulated conductor being guided through the shielding sleeve, the shielding sleeve having, at one longitudinal end, a housing-side sleeve area, and having, at another longitudinal end, a cable-side sleeve area;
    wherein the housing-side sleeve area of the shielding sleeve is situated in an area of the feed-through of the shielding housing, and the shielding housing abutting a jacket surface of the housing-side sleeve area, the cable shielding lying against a jacket surface of the cable-side sleeve area, the cable shielding being electrically connected to the shielding housing via the shielding sleeve, and
    wherein the shielding housing outwardly forms, in the area of the feed-through, contact clips that extend parallel to the jacket surface of the housing-side sleeve area, and are fastened so as to abut the jacket surface of the housing-side sleeve area.

2. The shielding system as recited in claim 1, wherein a diameter of the insulated conductor is smaller than an inner diameter of the shielding sleeve, so that the insulated conductor is movable in a radial direction in an internal region of the shielding sleeve.

3. The shielding system as recited in claim 1, wherein the cable shielding is radially movable, relative to the insulated conductor, outside the shielding housing and outside the shielding sleeve, in a region adjoining the shielding sleeve, so that the cable shielding in the region and the shielding sleeve are mechanically decoupled relative to one another.

4. The shielding system as recited in claim 3, wherein the radial movability is achieved in that the cable shielding in the region can be changed in shape, and is widened in the radial direction in the region.

5. The shielding system as recited in claim 1, wherein the shielding system has, in at least one of the housing-side sleeve area and in the cable-side sleeve area, a fastening strip running in a circumferential direction externally around the shielding sleeve, the fastening strip being fashioned to produce a press-on pressure on respective external surfaces of the contact clips, or a press-on pressure on the cable shielding in a direction of the jacket surfaces of the shielding sleeve, so that the contact clips or the cable shielding are fastened on the respective jacket surfaces of the shielding sleeve.

6. The shielding system as recited in claim 5, wherein a circumference of the fastening strip is adjustable to modify a press-on pressure of at least one of the contact clips and the cable shielding on the jacket surfaces of the shielding sleeve.

7. The shielding system as recited in claim 5, wherein the fastening strip has a metal.

8. The shielding system as recited in claim 5, wherein the fastening strip includes a plastic and is fashioned to enclose the cable shielding with the jacket surface of the cable-side sleeve area in contour-conforming fashion.

9. The shielding system as recited in claim 8, wherein the fastening strip is a shrink sleeve.

10. The shielding system as recited in claim 5, wherein the shielding sleeve has, at each of the longitudinal ends of the sleeve areas, bulges that run around in the circumferential direction and are radially outwardly directed.

11. The shielding system as recited in claim 10, wherein the contact clips run in stepped fashion in their extension from the shielding housing up to the jacket surface, so that a partial area of the contact clips in the area of the bulges is further away from a center axis of the shielding sleeve than is a partial area of the contact clips between the bulges of the housing-side sleeve area.

12. The shielding system as recited in claim 11, wherein a width of the strip in the longitudinal direction of the shielding sleeve is smaller than a distance between the two bulges of the respective sleeve areas.

13. The shielding system as recited in claim 1, wherein at least one of the housing-side sleeve area and the cable-side sleeve area have recesses or bulges on the jacket surfaces.

14. The shielding system as recited in claim 13, wherein a profile of the jacket surfaces is fashioned with a wavy shape.

15. A plug connector for a motor vehicle, the plug connector including a shielding system for a high current application, the shielding system comprising:
- a connecting cable having an insulated conductor and a cable shielding surrounding the insulated conductor;
- a shielding housing having a feed-through; and
- a hollow cylindrical electrically conductive shielding sleeve, the insulated conductor being guided through the shielding sleeve, the shielding sleeve having, at one longitudinal end, a housing-side sleeve area, and having, at another longitudinal end, a cable-side sleeve area;

wherein the housing-side sleeve area of the shielding sleeve is situated in an area of the feed-through of the shielding housing, and the shielding housing abutting a jacket surface of the housing-side sleeve area, the cable shielding lying against a jacket surface of the cable-side sleeve area, the cable shielding being electrically connected to the shielding housing via the shielding sleeve, and wherein the shielding housing outwardly forms, in the area of the feed-through, contact clips that extend parallel to the jacket surface of the housing-side sleeve area, and are fastened so as to abut the jacket surface of the housing-side sleeve area.

* * * * *